(12) United States Patent
Birang

(10) Patent No.: US 6,557,564 B1
(45) Date of Patent: May 6, 2003

(54) METHOD AND APPARATUS FOR CLEANING A THIN DISK

(75) Inventor: Manoocher Birang, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 154 days.

(21) Appl. No.: 09/698,818

(22) Filed: Oct. 26, 2000

Related U.S. Application Data

(60) Provisional application No. 60/162,741, filed on Oct. 30, 1999, and provisional application No. 60/162,805, filed on Nov. 1, 1999.

(51) Int. Cl.$^7$ ................................................. B08B 3/00
(52) U.S. Cl. ....................... 134/1.3; 134/103; 134/64 R; 134/102.2; 134/153; 134/1.3; 134/3; 310/334
(58) Field of Search ............................ 134/1, 1.3, 103, 134/102, 64 R, 102.2, 68, 153; 310/334; 702/105; 73/589

(56) References Cited

U.S. PATENT DOCUMENTS

| | | | | | |
|---|---|---|---|---|---|
| 3,601,717 A | * | 8/1971 | Kuecken | ..................... | 333/17.1 |
| 3,870,957 A | * | 3/1975 | Straw | ......................... | 455/117 |
| 4,466,288 A | * | 8/1984 | Grynberg et al. | ............. | 73/654 |
| 4,647,871 A | * | 3/1987 | Turner, Jr. | .................. | 330/298 |
| 5,496,411 A | * | 3/1996 | Candy | ........................... | 134/1 |
| 5,625,249 A | * | 4/1997 | Grant | .......................... | 310/334 |
| 6,047,246 A | * | 4/2000 | Vickers et al. | .............. | 702/105 |
| 6,104,287 A | * | 8/2000 | Meyer | ......................... | 340/539 |

* cited by examiner

Primary Examiner—Randy Gulakowski
Assistant Examiner—Gentle Winter
(74) Attorney, Agent, or Firm—Dugan & Dugan

(57) ABSTRACT

A megasonic tank system is provided that employs a monitoring system adapted to monitor power signals reflected from a transducer and to determine cleaning information based on the reflected power signals. The megasonic tank system includes a tank adapted to contain a fluid, a transducer coupled to the tank so as to transmit energy to the fluid, and a power supply coupled to the transducer and adapted to deliver energy thereto.

15 Claims, 2 Drawing Sheets

METHOD AND APPARATUS FOR CLEANING A THIN DISK

The present application claims priority from U.S. Provisional Patent Application Ser. No. 60/162,741, filed Oct. 30, 1999, the contents of which are hereby incorporated by reference herein in their entirety.

The present application also claims priority from U.S. Provisional Patent Application Ser. No. 60/162,805, filed Nov. 1, 1999, the contents of which are hereby incorporated by reference herein in their entirety.

FIELD OF THE INVENTION

The present invention relates generally to apparatus and methods for cleaning thin disks, such as semiconductor wafers, compact disks, glass wafers and the like.

BACKGROUND OF THE INVENTION

A conventional method for cleaning particles from semiconductor wafers is known as megasonic cleaning. During megasonic cleaning, a transducer oscillates between compressed and strained states at a near 1 MHz rate. The transducer is coupled to a fluid, either fluid in a fluid filled tank, or fluid flowing through a nozzle. The megasonic oscillation output by the transducer is thereby coupled to the fluid, causing a megasonic pressure oscillation therein. As the pressure in the fluid oscillates between positive and negative, cavitation or bubbles form in the liquid during negative pressure and collapse or shrink during positive pressure. This bubble oscillation gently cleans the surface of the wafer.

To cause the transducer to oscillate, a power supply is coupled to the transducer and is adapted to deliver energy thereto. However, due to an impedance mismatch a portion of the power supplied to the transducer typically is reflected from the transducer rather than being delivered thereto. Thus, efficiency of cleaning within the tank is reduced. Conventional megasonic cleaning apparatus provide a matching network that attempts to minimize the power reflected from a transducer, but that gleans no other information from the reflected power.

SUMMARY OF THE INVENTION

The invention provides a megasonic tank system having a controller that may monitor power signals reflected from a transducer ("reflected power signals") and that may determine cleaning information based on the reflected power signals. The megasonic tank system also comprises a tank adapted to contain a fluid, a transducer coupled to the tank so as to transmit energy to the fluid, and a power supply coupled to the transducer and adapted to deliver energy thereto.

Other features and aspects of the present invention will become more fully apparent from the following detailed description of the preferred embodiments, the appended claims and the accompanying drawings.

DETAILED DESCRIPTION OF THE PREFERRED EMBODIMENTS

Figure 1:
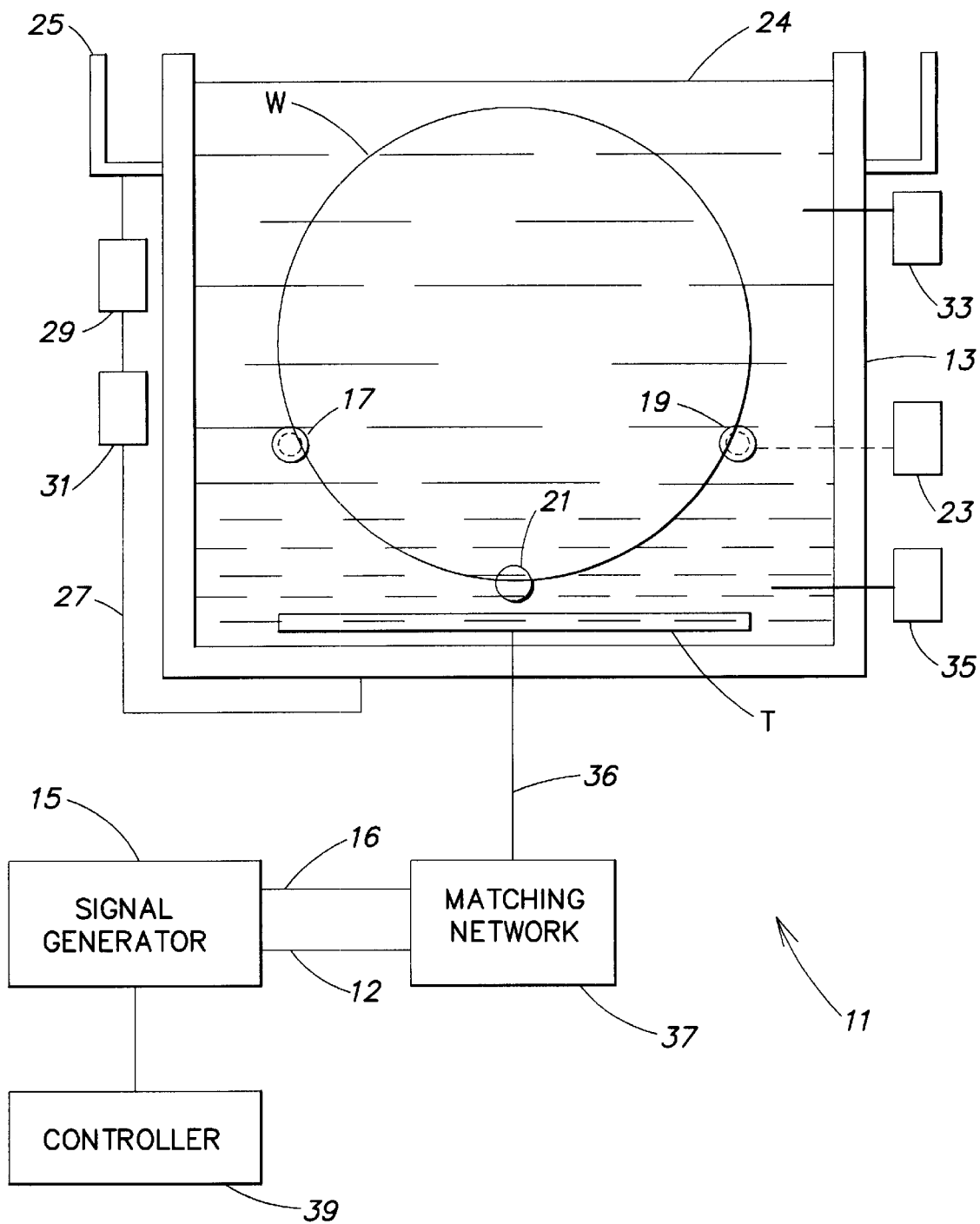
FIG. 1 is a front elevational view of a megasonic tank system that comprises an inventive monitoring system, which may monitor reflected power signals and may determine cleaning information based on the reflected power signals.

FIG. 1 is a front elevational view of a megasonic tank system 11 that comprises an inventive monitoring system, which may monitor power signals reflected from a transducer ("reflected power signals 12") and which may determine cleaning information based on the reflected power signals 12 as further described below. The megasonic tank system 11 also comprises a tank 13 (e.g., a plastic tank), having a transducer mechanism (e.g., a transducer T) positioned along the bottom thereof. In general, the transducer T may be positioned along any surface of the tank 13 (e.g., along a sidewall of the tank), and more than one transducer may be employed. A signal generator 15 (e.g., an RF power supply) is coupled to the transducer T and is adapted to deliver power thereto (e.g., megasonic power 16). In one aspect, the transducer T is equal in length to the diameter of a wafer W to be cleaned thereby. As stated, multiple transducers also may be employed.

Above the transducer T, a first wafer support 17 and a second wafer support 19 are positioned to vertically support a wafer W in line with the transducer T. A stabilizing mechanism 21 may be positioned at the wafer's baricenter so as to prevent horizontal movement of the wafer W. Typically, the wafer supports 17, 19 and the stabilizing mechanism 21 are rotatable, and in one aspect, each comprises a groove adapted to support the wafer W with minimal contact. The second wafer support 19 is coupled to a motor 23, which causes the wafer W to rotate.

The tank 13 is filled with a fluid 24 (e.g., deionized water, an ammonium hydroxide solution or any other known cleaning solution), and an overflow weir 25 is coupled near the top of the tank 13 so as to receive fluid overflow therefrom. A fluid connection such as a pipe 27 provides a recirculation path along the bottom of the overflow weir 25, through a pump 29, through a filter 31 and along the bottom of the tank 13, so that the fluid 24 may be recirculated and cleaned as described below.

The megasonic tank system 11 also may comprise a fluid sensor 33 that may detect the level of the fluid 24 in the tank 13 and/or may comprise a purity sensor 35 that may detect a level of contamination of the fluid 24. Both fluid sensors and purity sensors are well known in the art. The megasonic tank system 11 is preferably configured as described in U.S. patent application Ser. No. 09/191,057 now U.S. Pat. No. 6,119,708 (AMAT No. 2909/CMP/RKK), filed Nov. 11, 1998, the entire disclosure of which is incorporated herein by this reference.

As is known in the art, maximum power is transferred between the signal generator 15 and the load (transducer T) when the impedance of the load is equal to the impedance of the line delivering the power i.e., matched impedances. The RF power delivered to the load is called the "forward power", and if the load impedance is not matched with the line impedance, a portion of the RF power is reflected back from the load toward the signal generator called "reflected power". An efficient matching network 37 may ensure that the reflected power from a load is "zero" and the forward power to the load is "maximum".

The transducer T may convert the RF power to acoustic power. When the acoustic load in the tank 13 changes, it changes the RF/electrical impedance of the transducer T. The change in acoustic load could be due to any physical change that occurs in the tank 13, such as water level change, wafer position or orientation change, etc. This change can be detected as a RF impedance change and hence a change in the reflected power. For example, a megasonic cleaning apparatus is filled with the normal liquid to the normal level with a normal wafer in the normal position, and then an RF match circuit is tuned for maximum power delivery to the transducer T, and minimum reflected power. Now if there is any physical change in the megasonic cleaning apparatus that effects the acoustic impedance, the RF impedance will be effected as well, and hence the reflected power will be effected. If the reflected power is monitored and recorded phase and/or magnitude then the changes in liquid level, wafer presence, improper wafer position in the chamber, etc., can be sensed. This is a superior method to sense physical changes in the megasonic cleaning apparatus without intrusion and can give an indication for process repeatability in the megasonic cleaning apparatus.

In accordance with the present invention, an inventive monitoring system has been developed, which may monitor power signals reflected from the transducer T and which may determine cleaning information based on the reflected power signals 12 as further described below.

Figure 2:
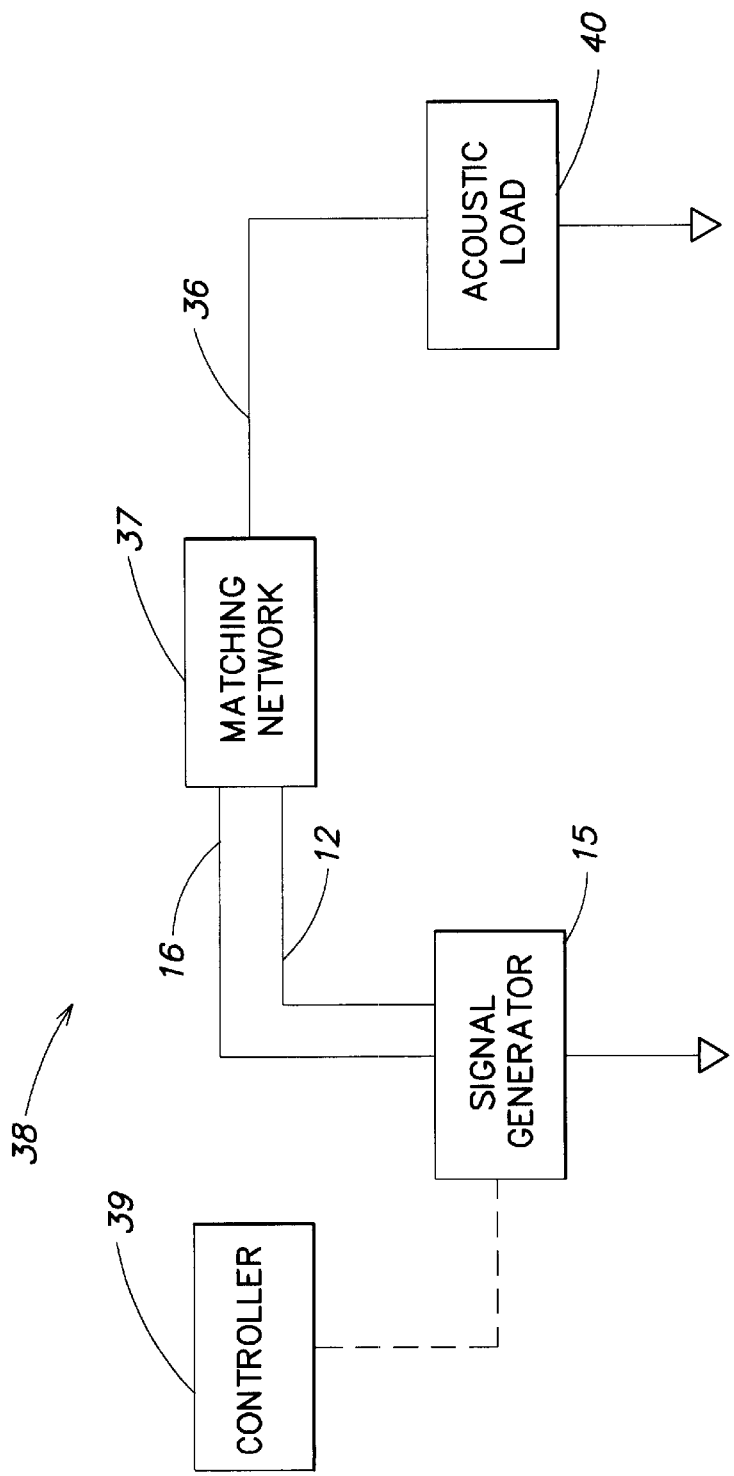
FIG. 2 is a diagrammatic view of the inventive monitoring system.

FIG. 2 is a diagrammatic view of an inventive monitoring system 38 configured in accordance with the present invention. The inventive monitoring system 38 comprises a controller 39 that is coupled to the signal generator 15, to the matching network 37, to the line 36 driving the transducer T, etc. The controller 39 may comprise any conventional microcontroller or microprocessor and is adapted to monitor power signals reflected from the transducer T and to generate an alarm if either the reflected power signal 12's magnitude and/or phase reaches a predetermined level or the reflected power signal 12's magnitude and/or phase remains within a pre-determined range of a level (e.g., if the reflected power signal 12's magnitude and/or phase remains approximately constant) for a predetermined period of time. The level about which the predetermined range is measured may or may not be predetermined (e.g., may or may not be known before the reflected power signal 12 is measured).

Also, based on the reflected power signal 12's magnitude, information may be obtained about the state of the tank 13 or about an ongoing cleaning process (e.g., cleaning information) as further described below. Such obtainable information includes, for example, the endpoint of a cleaning process, the health of the tank 13 (e.g., the contamination level of fluid 24), the level of the fluid 24 within the tank 13, wafer orientation on the wafer supports 17, 19, coupling less than optimum megasonic energy to the wafer W, etc.

In operation, the tank 13 is filled with the fluid 24 (a cleaning fluid such as an ammonium hydroxide solution, deionized water or any other known cleaning solution). A wafer handler (not shown) then lowers the wafer W into the tank 13, thereby submerging at least a portion of the wafer W within the fluid 24. The wafer W is put in optimum position with optimum process and the matching network is tuned for zero reflected power. Subsequently changes in reflected power is monitored to measure physical changes occurring in the tank 13. The signal generator 15 delivers oscillating electrical power 16 to the transducer T, and the transducer T converts the electrical power into a megasonic pressure oscillation within the fluid 24 that travels along the surfaces of the wafer W submerged in the fluid 24 (e.g., thus cleaning the surfaces of the wafer W submerged in the fluid 24).

The motor 23 is energized and rotates the second wafer support 19, causing the wafer W to rotate. As the wafer W rotates, the first wafer support 17 passively rotates therewith, thus preventing unnecessary friction between the first wafer support 17 and the wafer W which could damage the wafer W. The stabilizing mechanism 21 contacts the edge of the wafer W, reducing and preferably preventing wafer wobble.

As the wafer W rotates, the fluid 24 is continually pumped through the pipe 27 to the tank 13. The fluid 24 in the tank 13 therefore continually spills over the top of the tank 13 and into the overflow weir 25. The fluid 24 is then pumped from the overflow weir 25 through the filter 31 and back into the bottom of the tank 13, via the pump 29. Particles cleaned from the surface of the wafer W typically collect on the top of the fluid 24. Because the fluid 24 continually overflows into the overflow weir 25, the particles are therefore continually swept from the top surface of the fluid into the overflow weir 25. The filter 31 then filters particles from the fluid 24 and the fluid 24 is pumped back into the tank 13.

As previously stated, during cleaning, any variations within the tank 13, such as a change in cleaning fluid level, contamination of cleaning fluid, etc., may affect the acoustic load impedance and may generate reflected power signals 12 from the transducer T. The controller 39 monitors (e.g., constantly, periodically, randomly, etc.) any reflected power signal 12's magnitude and/or phase during the cleaning process, and monitors any change in the reflected power signal's magnitude and/or phase during the cleaning process.

The controller 39 may send an alarm if either the reflected power signal 12's magnitude and/or phase reaches a predetermined level or if the reflected power signal 12's magnitude and/or phase remains within a predetermined range of a level (e.g., remains approximately constant). For example, as a wafer W is cleaned, changes in the contamination level of the fluid 24 may alter the acoustic load impedance of the megasonic tank system 11 and may thus alter the magnitude and/or phase of the power reflected from the transducer T. However, once the wafer W is cleaned, variations in the acoustic load impedance may stabilize (e.g., as no more contaminants enter the fluid 24 from the wafer W) and the magnitude and/or phase of the reflected power may stabilize. The endpoint of a cleaning process thereby may be determined by, for example monitoring whether a reflected power signal 12's magnitude and/or phase has reached a predetermined level or whether the reflected power signal 12's magnitude and/or phase is staying within a predetermined range of some level. Likewise, a certain reflected power signal 12's magnitude and/or phase may indicate a state of the fluid 24 (e.g., the level of the fluid 24 in the tank 13 is too low, the fluid 24 is too contaminated, etc.). If the reflected power signal 12's magnitude and/or phase reaches a predetermined level, the controller 39 may generate an alarm, which alerts an operator that the cleaning process is over or to check the megasonic tank system 11 for the source of any undesirable process variations (e.g., a low cleaning fluid level). The fluid sensor 33 and the purity sensor 35 may be used in place of, or in addition to, the reflected power signal 12's magnitude and/or phase to monitor process variations or to monitor a cleaning process. Alternatively, if the reflected power signal 12's magnitude and/or phase reaches a predetermined level or remains approximately constant, the controller 39 may automatically stop the operation of the megasonic tank system 11.

Accordingly, by monitoring power signals reflected from the transducer T, information may be obtained about the state of the cleaning fluid 24 (e.g., contamination level, fluid level, etc.) or about an ongoing cleaning process (e.g., state of the cleaning process, endpoint of the cleaning process, etc.).

The foregoing description discloses only exemplary embodiments of the invention, modifications of the above-disclosed apparatus and method which fall within the scope of the invention will be readily apparent to those of ordinary skill in the art. For instance, the thin disk need not be vertically oriented, and the number and positioning of the thin disk supports may vary to accommodate alternative thin disk positions. The thin disk supports may comprise mechanisms other than grooved wheels, for example, simple bar type rollers may be used, although additional stabilizing mechanisms may be required. The inventive cleaning method and apparatus can be used within any tank cleaning systems including those which employ additional features to facilitate major surface cleaning, and/or edge cleaning. As used herein, a thin disk includes, but is not limited to a semiconductor wafer with or without material layers thereon, whether patterned or unpatterned. Although the energy employed is preferably megasonic, other frequencies may be employed.

Accordingly, while the present invention has been disclosed in connection with the preferred embodiments thereof, it should be understood that other embodiments may fall within the spirit and scope of the invention, as defined by the following claims.

The invention claimed is:

1. A method of cleaning a thin disk comprising:

submerging at least a portion of a thin disk in a tank containing a fluid, the tank having a transducer coupled thereto adapted to supply sonic energy to the fluid;

supplying power to the transducer so as to monitoring at least one of magnitude and a phase of a power signal reflected from the transducer; and determining cleaning information based on the at least one of the magnitude and the phase of the power signal reflected from the transducer;

wherein determining cleaning information comprises determining the endpoint of a cleaning process.

2. The method of claim 1 further comprising generating an alarm if the at least one of the reflected power signal magnitude and phase reaches a predetermined level.

3. The method of claim 2 wherein generating an alarm comprises generating an alarm if the at least one of the reflected power signal magnitude and phase remains within a predetermined range of a level for a predetermined period of time.

4. The method of claim 1 wherein the thin disk comprises a semiconductor wafer.

5. The method of claim 1 wherein the sonic energy comprises megasonic energy.

6. A method of cleaning information a thin disk comprising:

submerging at least a portion of a thin disk in a tank containing a fluid, the tank having a transducer coupled thereto adapted to supply sonic energy to the fluid;

supplying power to the transducer so as to transmit sonic energy to thin disk;

monitoring at least one of magnitude and a phase of a power signal reflected from the transducer; and determining cleaning information based on the at least one of the magnitude and the phase of the power signal reflected from the transducer;

wherein determining cleaning information comprises determining the level of contamination within the tank.

7. The method of claim 6 further comprising generating an alarm if the at least one of the reflected power signal magnitude and phase reaches a predetermined level.

8. The method of claim 7 wherein generating an alarm comprises generating an alarm if the at least one of the reflected power signal magnitude and phase remains within a predetermined range of a level for a predetermined period of time.

9. The method of claim 6 wherein the thin disk comprises a semiconductor wafer.

10. The method of claim 6 wherein the sonic energy comprises megasonic energy.

11. A method of cleaning a thin disk comprising:

submerging at least a portion of a thin disk in a tank containing a fluid, the tank having a transducer coupled thereto adapted to supply sonic energy to the fluid;

supplying power to the transducer so as to transmit sonic energy to thin disk;

monitoring at least one of a magnitude and a phase of a power signal reflected from the transducer; and determining an orientation of the thin disk within the tank based on the at least one of the magnitude and the phase of the power signal reflected from the transducer.

12. The method of claim 11 further comprising generating an alarm if the at least one of the reflected power signal magnitude and phase reaches a predetermined level.

13. The method of claim 12 wherein generating an alarm comprises generating an alarm if the at least one of the reflected power signal magnitude and phase remains within a predetermined range of a level for a predetermined period of time.

14. The method of claim 11 wherein the thin disk comprises a semiconductor wafer.

15. The method of claim 11 wherein the sonic energy comprises megasonic energy.

* * * * *